Feb. 2, 1971 A. E. SANERA 3,560,278

ALIGNMENT PROCESS FOR FABRICATING SEMICONDUCTOR DEVICES

Filed Nov. 29, 1968

INVENTOR
Arthur E. Sanera

BY Mueller, Aichele & Rauner

ATTY'S.

United States Patent Office 3,560,278

Patented Feb. 2, 1971

3,560,278
ALIGNMENT PROCESS FOR FABRICATING SEMICONDUCTOR DEVICES

Arthur E. Sanera, Lubbock, Tex., assignor to Motorola, Inc., Franklin Park, Ill., a corporation of Illinois Filed Nov. 29, 1968, Ser. No. 779,967
Int. Cl. H01l 7/44
U.S. Cl. 148—187 12 Claims

ABSTRACT OF THE DISCLOSURE

Disclosed is a process for fabricating semiconductor devices such as field-effect and bipolar transistors. A mask is formed on the surface of a semiconductor body and the semiconductor body is initially etched at three selected areas to expose three surface areas of the body. These areas define the locations through which impurity diffusions are made later in the process to form first, second and third regions within the semiconductor body. Next the first, second and third exposed areas of the body are recovered with a thin coating which serves as a diffusion mask to protect the second and third areas. Then the first area is reexposed by controlled etching in preparation for a first diffusion step in which an impurity is diffused through the first surface area to form a first active semiconductor device region within the body. Thereafter, the first surface area is covered by a mask while the thin coating is removed from the second and third surface areas to permit the subsequent diffusion of an impurity through these surface areas to form second and third active semiconductor device regions, respectively. Since the first, second and third surface areas were defined initially by the same masking and etching steps, the distance between the first and second regions is equal to the distance between the first and third regions. This precisely controlled spacing between the above device regions enables semiconductor devices to be fabricated with selected electrical characteristics.

BACKGROUND OF THE INVENTION

This invention relates generally to processes for fabricating junction field-effect and bipolar transistors. More particularly, this invention relates to an improved aligning and masking process which provides improved spacing of semiconductor device active regions formed by diffusion during the process.

Prior art processes for fabricating junction field-effect transistors, for example, employ separate etching or cutting steps in preparation for a gate diffusion and in preparation for source and drain diffusions, respectively. That is, after an oxide mask is formed on the surface of the semiconductor body, a first opening in the oxide mask is usually made in preparation for an impurity diffusion to form the gate region, and subsequently, additional openings are made in the oxide mask to diffuse therethrough the source and drain regions of the device. Using the above described prior art process, a slight photoresist mask misalignment on the surface oxide and used to expose those areas of oxide above the source and drain regions resulted in unequal distances between gate and source regions and gate and drain regions of the device. The gate to-drain and the gate-to-source distances determine device breakdown and other electrical characteristics of the device, so that a variance in these distances resulted in a JFET device having a low breakdown voltage and unsymmetrical electrical characteristics. Other semiconductor devices, such as bipolar transistors, can be similarly affected by the above photoresist mask misalignment.

SUMMARY OF THE INVENTION

An object of the present invention is to provide a new and improved process for fabricating semiconductor devices, including junction field-effect transistors, having improved breakdown and symmetrical electrical characteristics.

Another object of this invention is to provide a process for fabricating junction field-effect transistors in which improved control over the gate-to-source and gate-to-drain distances of the transistors may be realized.

Another object of this invention is to provide a process of the type described in which mask alignment is not critical.

A feature of the present invention is the initial critical delineation of selected surface areas on a semiconductor body on or through which subsequent semiconductor process operations may be performed. Different types of semiconductor operations such as different types of impurity diffusions may be performed through the selected surface areas by controlling the depth of the recoating of these surface areas, by controlling the etching of the recoated areas and by using the latter two controlled processing steps in combination with noncritical alignment of the selective masking of these surface areas.

These and other objects and features of this invention will become fully apparent in the following description of the accompanying drawings.

IN THE DRAWINGS

BRIEF DESCRIPTION OF THE INVENTION

Figures 1, 2, 3, 4, 5, 6, 7, 8, 9, 10:
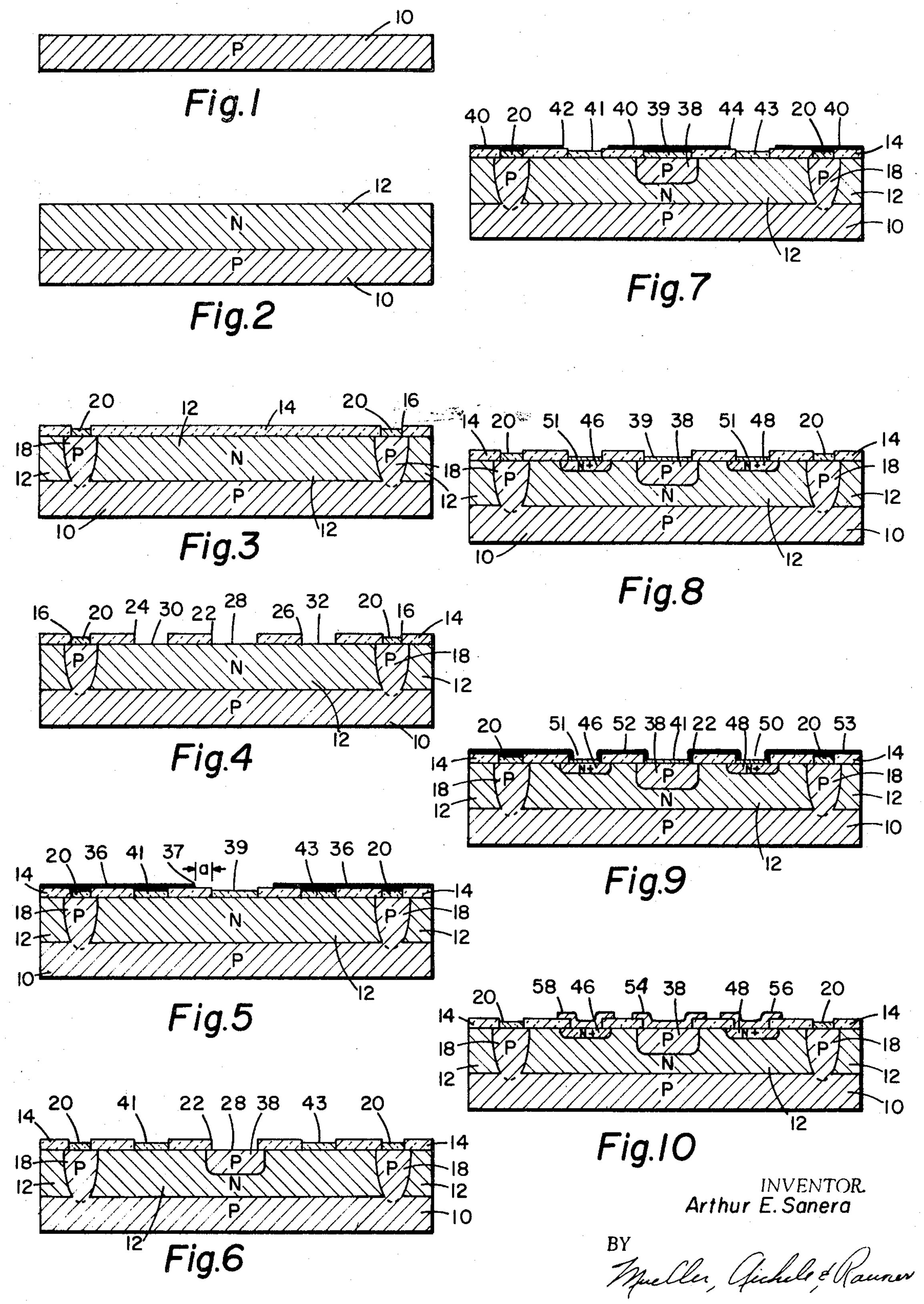
FIG. 1 shows the starting semiconductor wafer used in the process according to the present invention.
FIG. 2 illustrates the formation of an additional semiconductor layer on the starting wafer in FIG. 1.
FIG. 3 illustrates oxide formation and isolation diffusion steps performed on the structure shown in FIG. 2.
FIG. 4 illustrates an oxide etching or cutting step to establish the locations of the source, gate and drain regions within the ultimate structure produced by the process of this invention.
FIG. 5 illustrates a first photoresist masking step used in the process embodying the invention.
FIG. 6 illustrates an oxide etch step in preparation for a subsequent diffusion of the gate region for the JFET device produced.
FIG. 7 illustrates the formation of a second photoresist mask used in the present process.
FIG. 8 illustrates another oxide etch step and subsequent diffusion of N+ preohmic regions which provide good ohmic electrical contact to the source and drain regions of the semiconductor device produced by the present process.
FIG.9 illustrates another photoresist step in preparation for the application of metallization to the surface of the JFET device to form the source, drain and gate electrodes thereof.
FIG. 10 illustrates the application of metallization to the surface of the JFET device.

Briefly described, the process according to the present invention includes forming a coating on the surface of a semiconductor body and thereafter simultaneously making first, second and third openings in the coating to thereby expose first, second and third surface areas of the body. Subsequently, the second and third surface areas are masked while an impurity is diffused through the first area to form a first active semi-conductor device region within the body. Thereafter, the first surface and the first region thereunder are masked while another opposite conductivity type impurity is diffused through the second and third surface areas to thereby form second and third active semiconductor device regions within the body which are spaced an equal distance from the first region. Metallization is subsequently applied to portions of the first, second and third surface areas to form electrodes for the first, second and third active semiconductor device regions, respectively. Devices may be fabricated according to the present process to exhibit symmetrical or selected nonsymmetrical electrical characteristics and a relatively high breakdown voltage due to the precisely controlled spacing between first and second and the first and third active semiconductor device regions described above.

DETAILED DESCRIPTION OF THE INVENTION

Referring to the drawings, there is shown in FIG. 1 a semiconductor body or wafer 10 which may, for example, be a P type silicon wafer which has been cleaned and polished for subsequent processing to be described.

In FIG. 2 an N type layer 12 is formed on the wafer 10 by diffusion or epitaxial growth techniques which are well known in the semiconductor art.

In FIG. 3 an oxide layer 14 is formed on the upper surface of layer 12 either by thermal growth or by vapor deposition; both of these processing techniques are well known in the art. Using known photolithographic and photoresist techniques, openings 16 are formed in oxide coating 14 and by a subsequent impurity diffusion step, isolation regions 18 are formed. A portion of the N type layer 12 is now completely surrounded with P type material 10 and 18.

In forming junction field-effect transistors (JFET's) in accordance with the process of the present invention, it is common to initially perform the above-described isolation diffusion step and to then reform an oxide layer 20 either simultaneously with the isolation diffusion or subsequent to the isolation diffusion. However, the present invention is not limited to a process which includes by necessity this isolation diffusion step.

By selectively masking and etching the structure shown in FIG. 3 using known photolithographic techniques, first second and third openings 22, 24 and 26, respectively, are simultaneously formed in the oxide layer 14 to expose first, second and third surface areas 28, 30 and 32, respectively, on the upper surface of N type layer 12. The openings 22, 24 and 26 are made at this point in the process to define those surface areas through which gate, source and drain diffusions will be subsequently made. Thus, this step insures that the distance between gate and source regions and gate and drain regions of the JFET are precisely controlled throughout the process. In some applications it is desirable to have the gate-source distance exactly equal to the gate-drain distance in order to achieve symmetrical device characteristics, and this spacing is possible in accordance with the present invention. As will be seen more clearly hereinafter, the masking step used to selectively remove the oxide 16 and expose areas 28, 30 and 32 is the most critical step as far as mask alignment is concerned. If perfect alignment is not achieved in this step, the oxide cut can easily be made again with no loss in material. In other JFET applications and in the fabrication of various other types of semiconductor devices, it may be desirable to have the distances between areas 28 and 30 and areas 28 and 32 unequal but fixed, and such spacing may also be achieved in accordance with the present invention.

In order to prepare for a gate diffusion step, a thin layer of oxide 39, 41 and 43 is reformed over the exposed surfaces 28, 30 and 32 of the structure in FIG. 4 and then a photoresist mask 36 is applied to the oxide coated surface of the structure as shown in FIG. 5. This surface oxide is shown at regions 39, 41 and 43 in FIG. 5, and the photoresist mask 36 has an opening 37 therein which exposes the oxide portion 39 overlying the first surface area 28 on the surface of layer 12. Note that opening 37 may be misaligned by a distance $a$ in FIG. 5 and still obtain the desired results of exposing region 39. An etchant such as hydrofluoric acid is then applied to the oxide exposed by the opening 37 in the photoresist mask 36, and by controlling the etching time, the thin oxide region 39 can be removed from the first surface area 28 without further exposing the upper surface area of the structure in FIG. 5. After the thin oxide region 39 is removed from the first surface area 28 and the photoresist mask 36 is removed, a P type impurity such as boron is diffused through the opening 22 in FIG. 6 to form a first, P type region 38 within the N type semiconductor layer 12. During or subsequent to the diffusion of region 38 into the semiconductor layer 12, an oxide layer 41 is reformed over the first surface area 28 as shown in FIG. 7.

The next step in the present process is to apply another photoresist mask 40 (FIG. 7) having openings 42 therein which expose the oxide regions 43 and 41 covering the source and drain regions of the device. Note here, as in the application of the photoresist mask 36 in FIG. 5, that a critical mask alignment is not required. Again, by using the controlled hydrofluoric acid etchant, the oxide regions 41 and 43 are removed in preparation for an N+ preohmic diffusion step. When the photoresist layer 40 is removed, an N type impurity such as phosphorus is diffused through the second and third surface areas as shown in FIG. 8. This preohmic diffusion forms the N+ source and drain regions 46 and 48 of the junction field-effect transistor; these regions 46 and 48 prevent the conversion of the N type layer 12 to a P type conductivity material when a P type metallization such as aluminum is applied to form the surface electrodes of the structure. This preohmic N+ diffusion of the source and drain regions is typically carried out at approximately 1,000° C. for approximately 20 minutes. This diffusion is contrasted to the diffusion of the first or gate region 38 which is formed by a drive-in diffusion taking from two to two and one half hours at a diffusion temperature in the order of 1150° C. In carrying out the preohmic diffusion step in an oxidizing atmosphere, a very thin layer of oxide 51 is formed as shown in FIG. 8 on the surface of the N+ regions 46 and 48. During the two to two and one half hour drive-in diffusion for the gate region 38, a much thicker oxide layer 41 is formed as shown initially in FIG. 7.

Next, a photoresist mask 53 is applied on the oxide surface of the structure as shown in FIG. 9, and an etchant such as hydrofluoric acid is used to remove portions of the thin oxide layer 51 overlying the N+ regions 46 and 48, respectively, and a portion of the oxide layer 41 overlying the P type gate region 38. The oxide removal permits the subsequent formation of good electrical ohmic contact to the gate, source and drain regions 38, 46 and 48.

In FIG. 10, after the photoresist mask 53 is removed from the structure, electrodes 54, 56 and 58 are deposited as a surface overlay metallization to form the above mentioned electrical ohmic contact to the active gate, source and drain regions of the device.

Thus, there has been described a junction field-effect transistor with N+ source and drain regions 46 and 48 spaced an equal distance from the P type top-gate region 38.

Due to the closer spacings which may be achieved between the gate and source regions and the gate and drain regions of the structure according to the present invention, it is now possible to fabricate much higher frequency junction field-effect transistors than previously possible. In addition, JFETS which are fabricated using the above described process have higher current capabilities and higher drain-source breakdown voltages than those fabricated according to prior art processes. In addition, since the photoresist mask used when oxide openings are made has larger openings than the coating to be removed, photoresist mask alignment is not critical and device yields are consequently higher.

Another feature of the invention which results in higher yields is that the source, drain and gate oxide cuts are made at the same time. In known prior art processes, the most critical step is to precisely align the source and drain oxide cuts with respect to the previously fabricated gate region. If there is a misalignment of the source and drain cuts with respect to the gate region, then the wafer is destroyed and the process is started over. Contrary to this prior art technique, the present invention makes the first masking step the most critical step in the process. If this step is not performed so that the source, drain and gate cuts are properly aligned with respect to each other, then another cut can be made at this point with no loss of material. The latter feature results in reduced costs and increased yields, and this latter feature is particularly important in the fabrication of normally low yield, high frequency, small geometry devices.

It should be understood that the process according to the present invention is not limited to the fabrication of junction field-effect transistors. This process may also be used to fabricate bipolar transistors. In many instances it is desirable to locate the base contacts of a bipolar transistor an equal distance from the emitter contacts. In accordance with the present invention, electrodes 56 and 58 could form base contacts and electrode 54 could form the emitter contact if the device is to be used as a bipolar transistor. There are, however, obvious process differences in the fabrications of bipolar and field-effect transistors. Bipolar transistors require one particular base width or a range of base widths, whereas unipolar or field-effect transistors require another different width or range of widths for the channels thereof.

It should be further understood that the process according to the present invention is not limited to diffusion processes. On the contrary, once two or more surface areas of the semi-conductor body are delineated using the above described coating and masking techniques, then operations other than diffusions may be performed on or through these surface areas. For example, it may be desired to form a Schottky barrier PN junction at the surface of an exposed area or areas and this Schottky barrier junction may be formed, for example, by contacting the exposed areas with platinum silicide PtSi.

Another alternative to the diffusion process to form the device active regions is the use of ion implantation processes wherein high energy ionized ions, such as boron ions, are accelerated in the presence of an electric field. These ions penetrate the exposed surface areas mentioned above and form device active regions thereunder.

Finally, it may only be desired to make good ohmic contact to one or more of the exposed surface areas rather than convert the conductivity of the area. In any case, however, whether a diffusion process, a Schottky barrier process, an ion implantation process, or the formation of an ohmic contact is performed, all of these process steps may be defined as performing an operation on or through the exposed surface areas. This operation in combination with the other above described process steps embodies the broad scope of the present invention, and this invention is not limited to a particular semiconductor operation performed on or through the exposed surface areas of the semiconductor body.

In addition to the above alternative processing steps, the diffusion mask used is not limited to an oxide mask, and other materials such as silicon nitride may be used within the scope of this invention.

It is also within the scope of this invention to fabricate semiconductor devices where only two selected surface areas are initially delineated and subsequently exposed for a semiconductor process operation. It may be desired, for example, to control the spacing between base end emitter regions in accordance with the present invention. In this case, only two rather than three surface areas would be required, and the transistor collector region could be part of the original semiconductor starting material.

Therefore, it should be understood that the present invention is limited only by way of the following appended claims.

I claim:

1. A process for fabricating a semiconductor device including the steps of:

(a) forming a coating on a surface of a semiconductor body, (b) simultaneously removing selected portions of said coating to thereby define first and second areas on said semiconductor body on or through which an operation may be performed, (c) reforming a coating over said first and second areas, (d) applying a mask over said second surface area, (e) removing the coating overlying said first surface area, (f) performing an operation on or through said first surface area to impart a given electrical characteristic to said first surface area or the region beneath said first surface area, (g) applying another mask over said first surface area atop a coating thereon, (h) removing the coating on said second surface area of said semiconductor body, and (i) performing another operation on or through said second surface area to thereby impart a given electrical characteristic to said second surface area or the region underlying said second surface area whereby the spacing between said first and second surface areas is controlled precisely by the initial simultaneous removal of the surface coating atop the first and second surface areas.

2. The process defined in claim 1 wherein the operations performed in steps (f) and (i) include diffusing an impurity through said first and second surface areas to form semiconductor device active regions thereunder.

3. A process for fabricating a semiconductor device including steps of:

(a) forming a coating on the surface of a semiconductor body, (b) simultaneously removing selected portions of said coating to thereby define first, second and third surface areas on said semiconductor body through which an operation may be performed, (c) reforming a coating over said first, second and third surface areas and over the coating originally formed in (a), (d) applying a mask over said second and third surface areas, (e) removing the coating overlying said first surface area while leaving undisturbed the coating protected by said mask, (f) removing said mask covering said second and third surface areas atop the coating thereon, (g) performing an operation on or through said first surface area to define a first region within said semiconductor body while reforming a coating over said first surface area, (h) applying another mask over said first surface area atop the coating thereon, (i) removing the coating on said second and third surface areas of said semiconductor body, (j) removing said another mask atop said coating over said first surface area, and (k) performing another operation on or through said second and third surface areas to thereby define second and third regions within said body which are spaced controlled distances from said first region, whereby the spacing and the electrical characteristics between said first and second regions and between said first and third regions may be precisely controlled.

4. The process defined in claim 3 which further includes applying metallization to said first, second and third surface areas to thereby provide electrical ohmic contact to said first, second and third regions, respectively.

5. The process defined in claim 3 wherein:

(a) forming said coating in step (a) includes oxidizing the surface of said semiconductor body to form thereon a coating of silicon oxide.

(b) said moving portions of said coating in step (b) includes forming a photoresist mask on the surface of said silicon oxide and having openings therein exposing the silicon oxide overlying said first, second and third surface areas, and selectively applying a silicon oxide etch to the oxide exposed by said openings in said photoresist mask to thereby remove said silicon oxide and epose said first, second and third surface areas.

6. The process defined in claim 5 wherein the reforming of said coating over said first, second and third surface areas includes reoxidizing said semiconductor body to form a thin oxide coating covering said first, second and third surface areas.

7. The process defined in claim 6 which further includes selectively removing said thin oxide coating covering said first, second and third surface areas so that by performing a semiconductor process operation on or through said first, second and third surface areas to define respectively first, second and third regions in said semiconductor body, said first, second and third regions will have locations fixed with respect to the initial simultaneous removal of oxide covering said first, second and third surface areas.

8. The process defined in claim 7 wherein the removal of said thin oxide is performed by applying an oxide etchant thereto for a time sufficient to remove said thin oxide and insufficient to remove other oxide on the surface of said body.

9. A process for fabricating a semiconductor device including the steps of:

(a) forming a coating on the surface of a semiconductor body, (b) simultaneously removing selected portions of said coating to thereby define first, second and third surface areas on said semiconductor body through which impurities are subsequently diffused, (c) diffusing an impurity of one conductivity type through said first surface area while masking against such impurity diffusion over said second and third surface areas, and (d) thereafter masking over said first surface area while diffusing an opposite conductivity type impurity through said second and third surface areas on said semiconductor body to form second and third regions therein spaced equal distances from said first region.

10. The process defined in claim 9 which further includes applying metallization to said first, second and third surface areas to thereby provide electrical ohmic contact to said first, second and third regions, respectively.

11. The process defined in claim 10 wherein:

(a) the forming of said coating includes oxidizing the surface of said semiconductor body to form thereon a coating of silicon oxide, and (b) the masking of said first, second and third surface areas includes applying a photoresist mask to selected areas of the silicon oxide to protect the oxide thereunder while removing at different times the oxide overlying said first, second and third surface areas to permit the diffusion of an impurity through said first, second and third surface areas to thereby form first, second and third regions, respectively.

12. The process defined in claim 11 wherein the removal of said silicon oxide overlying first, second and third surface areas is performed by applying an oxide etchant thereto for a time sufficient to remove the oxide overlying said first, second and third surface areas and insufficient to remove other silicon oxide from the surface of said semiconductor body.

References Cited

UNITED STATES PATENTS

| | | | |
|---|---|---|---|
| 3,342,650 | 9/1967 | Seki et al. | 148—187 |
| 3,410,735 | 11/1968 | Hackley | 148—187 |

L. DEWAYNE RUTLEDGE, Primary Examiner

R. A. LESTER, Assistant Examiner

U.S. Cl. X.R.

29—576, 578